(12) United States Patent
Smith (10) Patent No.: US 7,624,904 B1
(45) Date of Patent: Dec. 1, 2009

(54) CALIBRATION APPARATUS FOR BONDHEAD OF WIRE BONDING MACHINE

(75) Inventor: John J. Smith, Hatboro, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 12/239,916

(22) Filed: Sep. 29, 2008

(51) Int. Cl.
  *B23K 31/02* (2006.01)
  *H01L 21/60* (2006.01)

(52) U.S. Cl. ............... 228/4.5; 228/105; 228/180.5

(58) Field of Classification Search ............ 228/56.5, 228/4.1, 4.5, 103, 105, 180.5
  See application file for complete search history.

(56) References Cited

U.S. PATENT DOCUMENTS

| | | | |
|---|---|---|---|
| 5,927,587 A | * | 7/1999 | Koduri .............. 228/4.5 |
| 6,112,972 A | * | 9/2000 | Koduri .............. 228/180.5 |
| 6,176,414 B1 | | 1/2001 | Sadler |
| 6,412,683 B1 | | 7/2002 | Beatson et al. |
| 7,377,415 B2 | | 5/2008 | Frasch et al. |

\* cited by examiner

*Primary Examiner*—Jessica L. Ward
*Assistant Examiner*—Kevin E Yoon
(74) *Attorney, Agent, or Firm*—Christopher M. Spletzer, Sr.

(57) ABSTRACT

A wire bonding machine including a bondhead assembly having a transducer and a bonding tool is provided. The bondhead assembly is configured for substantially vertical movement with respect to a bonding surface of the wire bonding machine during a wire bonding operation. The wire bonding machine further includes a camera configured to receive images of a portion of the bondhead assembly, the images being used to determine a position where a length of the transducer is substantially parallel to the bonding surface.

13 Claims, 7 Drawing Sheets

CALIBRATION APPARATUS FOR BONDHEAD OF WIRE BONDING MACHINE

FIELD OF THE INVENTION

This invention relates to a calibration apparatus for a bondhead of a wire bonding machine and, more particularly, to a calibration apparatus that may be used to identify the perpendicularity of a bonding tool with respect to a bonding surface.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected.

An exemplary conventional wire bonding sequence utilizing ball bonding includes: (1) forming a free air ball on an end of a wire extending from a bonding tool; (2) forming a first bond on a die pad of a semiconductor die using the free air ball; (3) extending a length of wire in a desired shape between the die pad and a lead of a leadframe; (4) stitch bonding the wire to the lead of the leadframe (forming a second bond); and (5) severing the wire. In forming the bonds between (a) the ends of the wire loop and (b) the bond site (e.g., a die pad, a lead, etc.) varying types of bonding energy may be used including, for example, ultrasonic energy, thermosonic energy, and thermocompressive energy, amongst others. As is known to those skilled in the art, this sequence is exemplary in nature, and the order may be changed in a given application (e.g., the first bond may be formed on the substrate, etc.).

U.S. Pat. Nos. 7,377,415 entitled "Bond Head Link Assembly for a Wire Bonding Machine"; 6,412,683 entitled "Cornercube Offset Tool"; and 6,176,414 entitled "Linkage Guided Bond Head" relate to the field of bondhead assemblies and vision systems used in connection with wire bonding operations, and are hereby incorporated by reference in their entirety.

To help ensure proper orientation of the various components throughout the wire bonding process (and, thus, to help achieve a high quality bond), it is desirable to calibrate a bondhead assembly (e.g., including a transducer and a bonding tool) by defining a "zero" parameter of the bondhead assembly and, more specifically, the substantial perpendicularity of the transducer with respect to a Z axis. Due to the substantially perpendicular relationship between the bonding tool and the transducer, defining the "zero" parameter of the bondhead assembly also generally defines the substantial perpendicularity of the bonding tool with respect to a bonding surface.

An example of a conventional calibration method for bondheads includes a manual, iterative technique that typically begins with the removal of various components of the wire bonding machine (e.g., an electronic flame-off wand, etc.). More specifically, a perpendicularity gage is placed on the bonding surface below the transducer. An operator manually manipulates the transducer in relation to the perpendicularity gage and, through the use of a Z-axis encoder, defines the "zero" parameter of the bondhead assembly. The previously removed components of the wire bonding machine are then re-installed to support a wire bonding operation. Such a manual, iterative technique (1) requires a particular level of operator skill, (2) is susceptible to human error, (3) is undesirably time consuming, and (4) adds to the cost of the wire bonding operation.

Thus, it would be desirable to provide an improved calibration apparatus and method to overcome one or more of the deficiencies of conventional calibration methods for bondheads.

SUMMARY OF THE INVENTION

According to an exemplary embodiment of the present invention, a wire bonding machine includes a bondhead assembly having a transducer and a bonding tool. The bondhead assembly is configured for substantially vertical movement with respect to a bonding surface of the wire bonding machine during a wire bonding operation. The wire bonding machine further includes a camera configured to receive images of a portion of the bondhead assembly, the images being used to determine a position where a length of the transducer is substantially parallel to the bonding surface.

According to another exemplary embodiment of the present invention, a method of determining a position on a wire bonding machine where a length of a transducer of the wire bonding machine is substantially parallel to a bonding surface of the wire bonding machine includes moving a bondhead assembly (including a transducer and a bonding tool) of the wire bonding machine along a Z axis. Images of a portion of the bondhead assembly during the movement along the Z axis are received using a camera. A position where the bonding tool is substantially perpendicular to the bonding surface is determined using the images received by the camera.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

As explained above, a conventional calibration method for a bondhead assembly includes a manual, iterative technique that is time consuming and susceptible to human error.

According to certain exemplary embodiments of the present invention, a wire bonding machine includes a camera configured to receive images of a portion of the bondhead assembly, the images being used to determine a position where a length of the transducer of the bondhead assembly is substantially parallel to the bonding surface (e.g., a heat block of the wire bonding machine or some other bonding surface of the wire bonding machine).

For example, the images received by the camera are used by a computer program or algorithm to derive a position of a Z-axis encoder (e.g., a conventional Z-axis encoder on the back end of the bondhead assembly) that corresponds to the position where the transducer is substantially parallel to the bonding surface. If desired, the program or algorithm may then set/re-set the "zero" height/parameter position of the wire bonding machine to be a specific Z-axis encoder position (e.g., a zero position).

More specifically, defining such a "zero" height/parameter of the bondhead assembly can be used in conjunction with other parameters of a wire bonding machine for completing wire bonding operations. For example, other parameters that may be used in connection with the "zero" height/parameter include (1) the die thickness, (2) the substrate thickness, and (3) the distance the heat block should be raised to achieve the desired bond height, amongst others.

Referring generally to FIGS. 1-5, a simplified bondhead assembly (with various features omitted for simplicity) having a transducer and a bonding tool is shown. The various exemplary embodiments of the bondhead assembly of the present invention may be connected to a wire bonding machine (not shown) through any conventional fastening means (e.g., linkages, fasteners, etc.).

Figure 1:
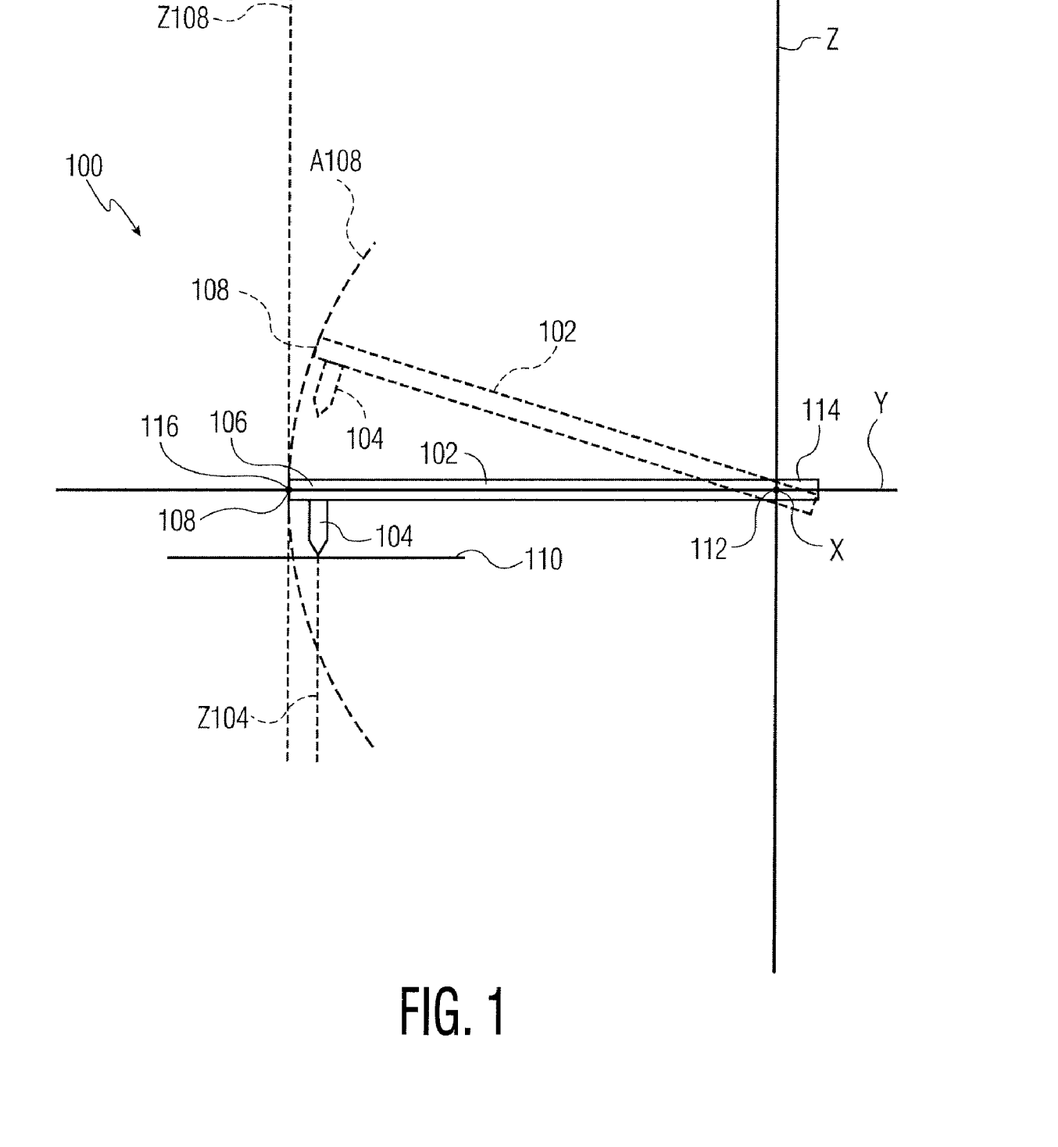
FIG. 1 is a right side view, block diagram representation of a transducer and a bonding tool of a bondhead assembly, presented to supplement illustrations of the various exemplary embodiments of the present invention.

FIG. 1 is a right side view, block diagram representation of a transducer and bonding tool included in a bondhead assembly. The depiction of FIG. 1 is presented to supplement illustrations of the various exemplary embodiments of the present invention. The configuration and operation of the transducer and bonding tool described with reference to FIG. 1 is generally consistent throughout the various exemplary embodiments of the bondhead assembly of the present invention represented in FIGS. 2A-5 and, as such, like reference numerals represent like components and features throughout FIGS. 1-5.

A wire bonding sequence is generally accomplished along an X-Y-Z coordinate system. As shown in FIG. 1, bondhead 100 of the wire bonding machine (not shown) includes transducer 102 that extends substantially horizontally along a Y axis (in the solid line representation of transducer 102 in FIG. 1). In other words, the length of transducer 102 is longitudinal and extends substantially along the Y axis. Bonding tool 104 is attached to forward portion 106 of transducer 102 and extends substantially perpendicular to transducer 102 and vertically along Z axis Z104 (in the solid line representation of bonding tool 104 in FIG. 1). A forward-most point at the tip of transducer is labeled as 108. An X axis extends perpendicular to each of the Y axis and Z axis in the same horizontal plane as the Y axis. In FIG. 1, the X axis extends in and out of the page. The horizontal plane defined by the X axis and Y axis is substantially parallel to bonding surface 110 of the wire bonding machine (e.g., the heat block of the wire bonding machine).

It is understood that the X, Y, and Z axis labels apply to any respective parallel axis. In other words, although the X-Y-Z coordinate system is labeled with respect to pivot point 112 in FIG. 1, it is appropriate to state that, for example, bonding tool 104 extends vertically along Z axis Z104 (as explained above) since the length of bonding tool 104 extends substantially parallel to the Z axis defined at pivot point 112. This parallel axis convention applies to the X, Y, and Z axes throughout FIGS. 1-5.

Pivot point 112 at rearward portion 114 of transducer 102 allows transducer 102 to swing up and down (as represented by the phantom lines of transducer 102 and bonding tool 104) causing forward-most point 108 of transducer 102 to travel in an arc A108. As is known to those skilled in the art, this arc motion is typically the Z-axis motion of the bondhead assembly when forming wire loops. Also as is known to those skilled in the art, the actual swing of this arc motion is more subtle than the arc motion represented in the drawings; thus, it is understood that the arc motion may be accentuated in the drawings for illustrative purposes. A phantom line representation of transducer 102 and bonding tool 104 in a downward position below the Y axis along arc A108 is omitted for the sake of clarity. The point at which forward-most point 108 of transducer 102 aligns with the Y axis is when transducer 102 is substantially parallel to bonding surface 110 (as shown in the solid line representation of transducer 102 in FIG. 1). Z axis Z108 is defined as the Z axis along which forward-most point 108 of transducer 102 aligns with the Y axis.

Stated another way, it will be understood that arc A108 passes through various Z axes (not shown for the sake of clarity) along its path. Z axis Z108 is the Z axis through which arc A108 of forward-most point 108 passes that is furthest from the Z axis defined at pivot point 112. This point of alignment between forward-most point 108, the Y axis, and Z axis Z108 is defined as a "zero" parameter of the bondhead assembly, and is labeled in FIG. 1 as numeral 116. As explained above, to assist in the establishment of the proper orientation of the various components throughout the wire bonding process (and, thus, to help achieve a high quality bond), it is desirable to calibrate bondhead 100 by defining "zero" parameter 116 of bondhead assembly 100 and, more specifically, the perpendicularity of transducer 102 with respect to the Z axis. In other words, it is desirable to calibrate bondhead 100 by determining a position where the length of transducer 102 is substantially parallel to bonding surface 110. Due to the substantially perpendicular relationship between bonding tool 104 and transducer 102, defining "zero" parameter 116 of bondhead assembly 100 also substantially defines the perpendicularity of bonding tool 104 with respect to bonding surface 110 residing in a horizontal plane defined by the X axis and Y axis.

Figure 2A:
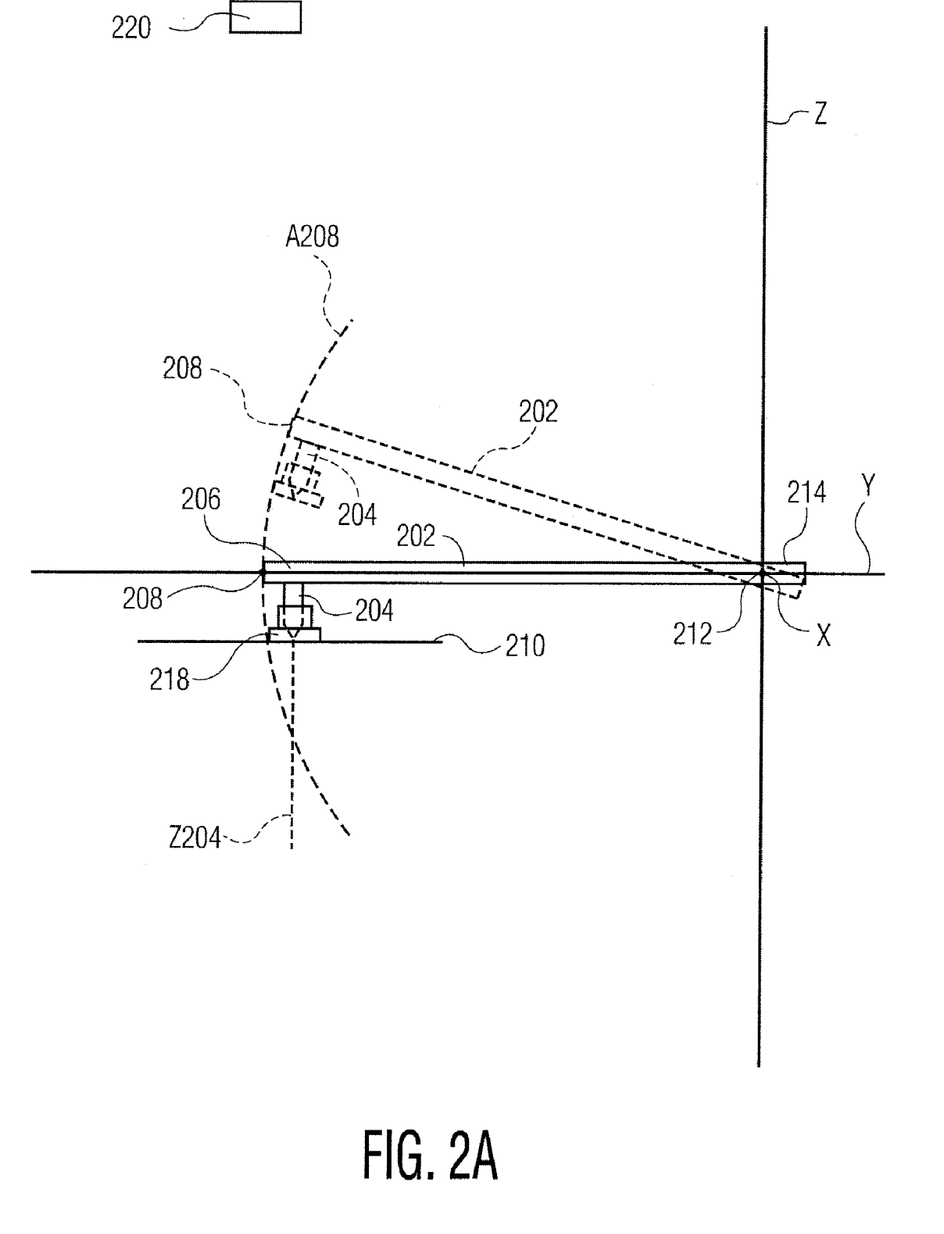
FIG. 2A is a right side view, block diagram representation of a bondhead assembly in accordance with an exemplary embodiment of the present invention.

FIG. 2A illustrates bondhead assembly 200 of a wire bonding machine, bondhead assembly 200 including transducer 202 and bonding tool 204. Bondhead assembly 200 further includes a detection member 218 that will be described in greater detail below with reference to FIG. 2B. Bondhead assembly 200 is configured for substantially vertical movement (e.g., along an arc motion) with respect to bonding surface 210 during a wire bonding operation (using a Z-axis motor or the like).

The wire bonding machine further includes camera 220 configured to receive images of a portion of bondhead assembly 200, the images being used to determine a position where transducer 202 is substantially parallel to bonding surface 210 (and, thus, a position where bonding tool 204 of bondhead assembly 200 is substantially perpendicular to bonding surface 210) in conjunction with a Z axis calibration of bondhead assembly 200. As will be explained in greater detail below with reference to FIG. 2B, bondhead 200 is calibrated by defining a "zero" parameter of bondhead assembly 200 and, more specifically, the perpendicularity of transducer 202 with respect to the Z axis.

Figure 2B:
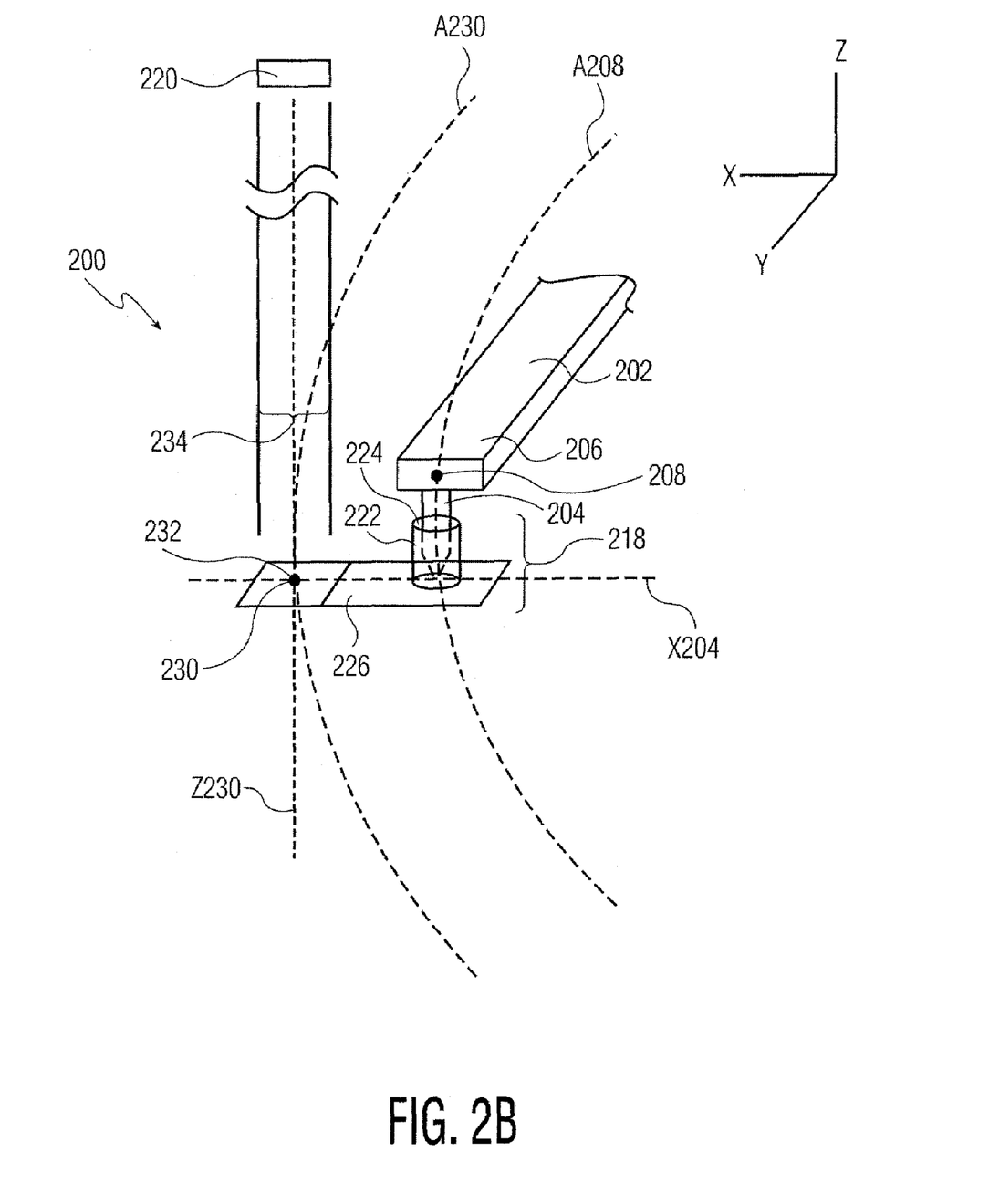
FIG. 2B is a perspective detail view of a portion of the bondhead assembly of FIG. 2A.

Camera 220 is mounted at the left side of transducer 202 (behind transducer 202 with respect to the X axis as represented in FIG. 2A) with a field of view extending along a Z axis. FIG. 2B provides greater clarity as to the X axis relationship between camera 220 and transducer 202.

FIG. 2B is a perspective detail view of a portion of bondhead assembly 200 of FIG. 2A as viewed substantially along the Y axis (see X-Y-Z axis convention denoted in FIG. 2B). Detection member 218 of bondhead assembly 200 includes bonding tool engagement mechanism 222 defining an aperture 224 configured to receive a portion of bonding tool 204 for securement to bonding tool 204 during calibration of bondhead assembly 200. Detection member 218 further includes marker 226 extending from bonding tool engagement mechanism 222 to a field of view 234 of camera 220 (e.g., into the page of FIG. 2A). Marker 226 may include an image point 230 to further facilitate a precise calibration process. Camera 220 is configured to receive images of marker 226 and, more specifically, image point 230, to derive the position where transducer 202 is substantially parallel to bonding surface 210 (shown in FIG. 2A) and, accordingly, the position where bonding tool 204 of bondhead assembly 200 is substantially perpendicular to bonding surface 210.

As explained above, forward-most point 208 of transducer 202 travels in an arc A208 (labeled in FIGS. 2A and 2B). In FIG. 2B, the arc of image point 230 is labeled as A230. In this example, the point at which image point 230 aligns with the Y axis is when transducer 202 is positioned substantially parallel to bonding surface 210 (shown in FIG. 2A). Specifically with respect to image point 230, Z axis Z230 is the Z axis through which arc A230 of image point 230 passes that is furthest from the Z axis defined at pivot point 212 (i.e., the point at which image point 230 extends furthest along a Y axis from pivot point 212). This point of alignment is defined as a "zero" parameter of bondhead assembly 200, and is labeled in FIG. 2B as numeral 232. Due to the substantially perpendicular and parallel relationships between marker 226, bonding tool 204, and transducer 202, defining "zero" parameter 232 of bondhead assembly 200 also substantially defines the perpendicularity of bonding tool 204 with respect to bonding surface 210.

Thus, when detection member 218 is in field of view 234 of camera 220, camera 220 detects when image point 230 is furthest from the Z axis defined at pivot point 212, thereby identifying "zero" parameter 232 of bondhead assembly 200. As explained above, to help ensure proper orientation of the various components throughout the wire bonding process (and, thus, to help achieve a high quality bond), it is desirable to calibrate bondhead 200 by defining "zero" parameter 232 of bondhead assembly 200 by determining the position where transducer 202 is substantially parallel to bonding surface 210 (in other words, the substantial perpendicularity of transducer 202 with respect to the Z axis).

Image point 230 of marker 226 is represented in FIG. 2B as a dot. Alternatively, image point 230 may be an "X", a star, a notch, or any other marking that is detectable by camera 220. Similarly, although image point 230 is represented substantially toward an end of marker 226, image point 230 may reside in any location on marker 226 that is detectable by camera 220.

Detection member 218 may comprise a plurality of pieces or, alternatively, may be formed as one piece. Aperture 224 of bonding tool engagement mechanism 222 of detection member 218 may be press fit onto bonding tool 204 for securement to bonding tool 204. Alternatively, detection member 218 may be secured to bonding tool 204 via adhesive, a snap fit, or any other suitable securing mechanism. Detection member 218 may be formed from plastic, composite material, metal, or any other suitable material that performs the functions described above.

Figure 3A:
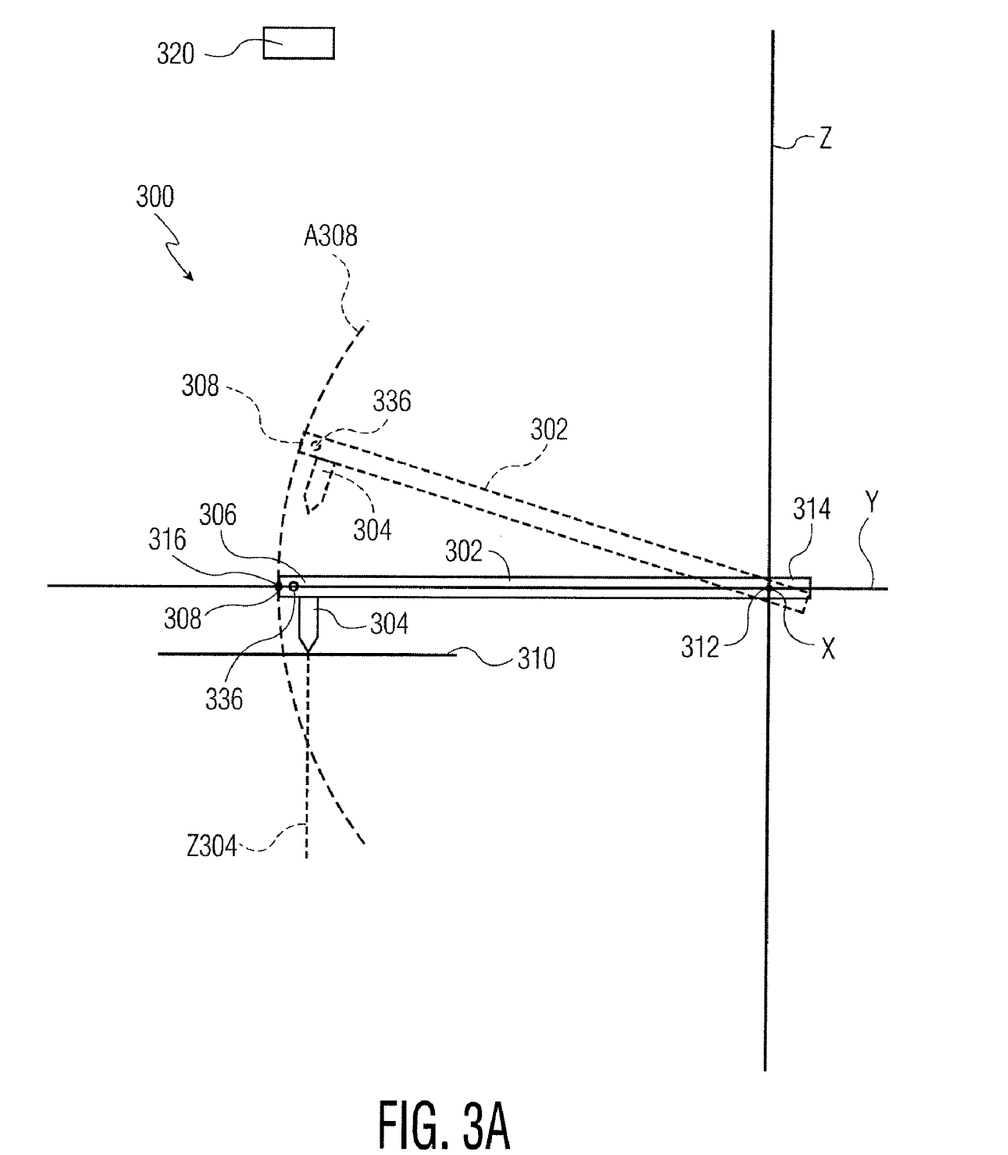
FIG. 3A is a right side view, block diagram representation of a bondhead assembly in accordance with another exemplary embodiment of the present invention.

FIG. 3A illustrates bondhead assembly 300 of a wire bonding machine, bondhead assembly 300 including transducer 302 and bonding tool 304. Bondhead assembly 300 further includes a detection member 336 that will be described in greater detail below with reference to FIG. 3B. Bondhead assembly 300 is configured for substantially vertical movement with respect to bonding surface 310 during a wire bonding operation.

The wire bonding machine further includes camera 320 configured to receive images of a portion of bondhead assembly 300, the images being used to determine a position where transducer 302 is substantially parallel to bonding surface 310 (and, thus, a position where bonding tool 304 of bondhead assembly 300 is substantially perpendicular to bonding surface 310) in conjunction with a Z axis calibration of bondhead assembly 300. As will be explained in greater detail below with reference to FIG. 3B, bondhead 300 is calibrated by defining a "zero" parameter of bondhead assembly 300 and, more specifically, the perpendicularity of transducer 302 with respect to the Z axis.

Figure 3B:
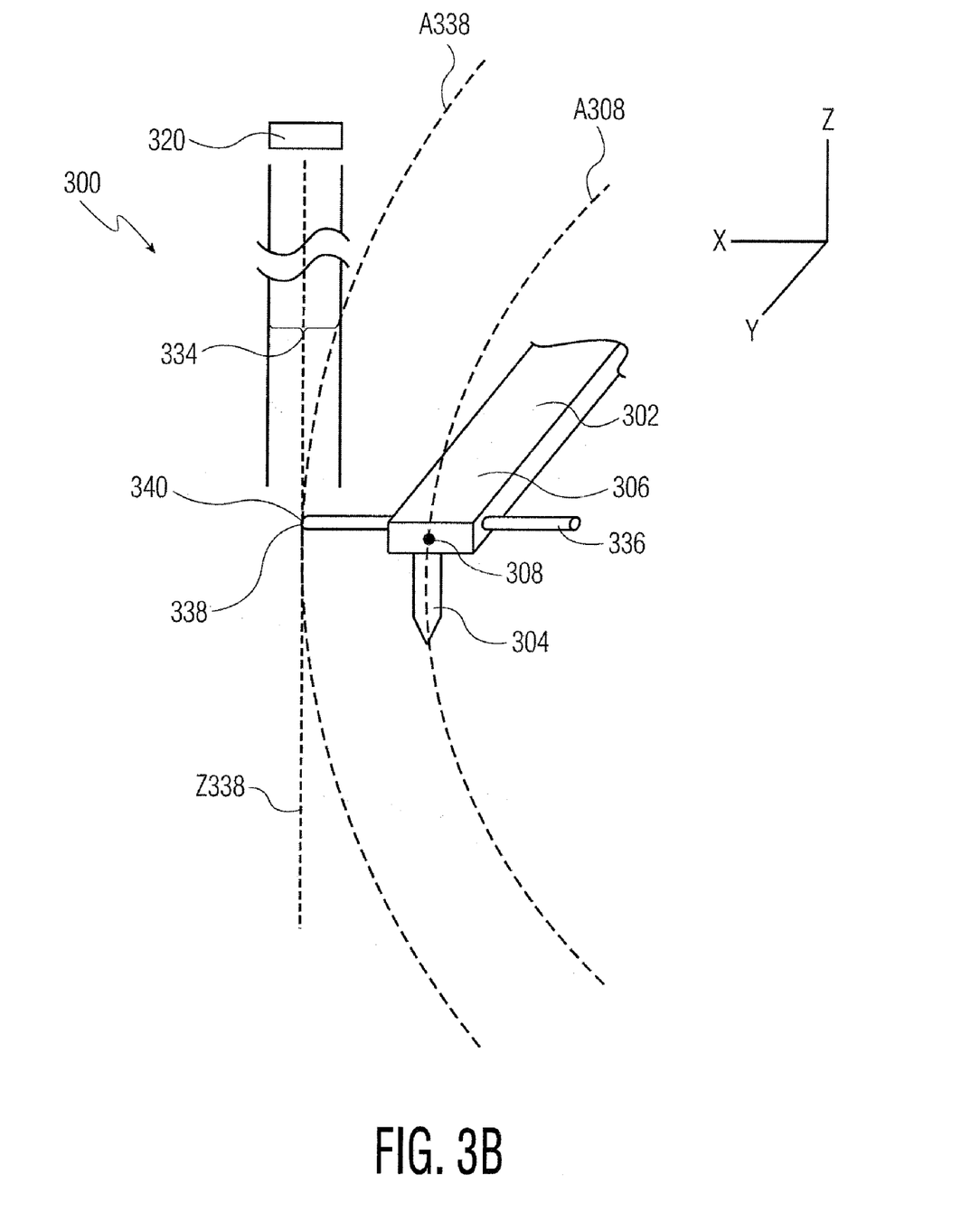
FIG. 3B is a perspective detail view of a portion of the bondhead assembly of FIG. 3A.

Camera 320 is mounted at the left side of transducer 302 (behind transducer 302 with respect to the X axis as represented in FIG. 3A) with a field of view extending along a Z axis. FIG. 3B provides greater clarity as to the X axis relationship between camera 320 and transducer 302.

FIG. 3B is a perspective detail view of a portion of bondhead assembly 300 of FIG. 3A as viewed substantially along the Y axis (see X-Y-Z axis convention denoted in FIG. 3B). In contrast to detection member 218 of bondhead assembly 200 attached to bonding tool 204 as described above with respect to FIGS. 2A and 2B, detection member 336 of bondhead assembly 300 is connected to transducer 302 of bondhead assembly 300 during calibration of bondhead assembly 300 as represented in FIG. 3B. More specifically, detection member 336 extends from a portion of transducer 302 and, even more specifically, detection member 336 is a pin 336 extending through forward portion 306 of transducer 302. Pin 336 extends from transducer 302 to a field of view 334 of camera 320 (e.g., into the page of FIG. 3A) during calibration of bondhead assembly 300. Camera 320 is configured to receive images of pin 336 and, more specifically, image point 338 (e.g., end point) of pin 336, to derive the position where transducer 302 is substantially parallel to bonding surface 310 (shown in FIG. 3A) and, accordingly, the position where bonding tool 304 of bondhead assembly 300 is substantially perpendicular to bonding surface 310.

As explained above, forward-most point 308 of transducer 302 travels in an arc A308 (labeled in FIGS. 3A and 3B). In FIG. 3B, the arc of image point 338 is labeled as A338. The point at which image point 338 aligns with the Y axis is when transducer 302 is positioned substantially parallel to bonding surface 310. Specifically with respect to image point 338, Z axis Z338 is the Z axis through which arc A338 of image point 338 passes that is furthest from the Z axis defined at pivot point 312. This point of alignment is defined as a "zero" parameter of bondhead assembly 300, and is labeled in FIG. 3B as numeral 340. Due to the substantially perpendicular and parallel relationships between pin 336, transducer 302, and bonding tool 304, defining "zero" parameter 340 of bondhead assembly 300 also substantially defines the perpendicularity of bonding tool 304 with respect to bonding surface 310.

Thus, when detection member 336 is in field of view 334 of camera 320, camera 320 detects when image point 338 is furthest from the Z axis defined at pivot point 312, thereby determining the position where transducer 302 is substantially parallel to bonding surface 310 (in other words, the substantial perpendicularity of transducer 302 with respect to the Z axis).

Image point 338 of pin 336 is represented in FIG. 3B at an end of pin 336. Alternatively, image point 338 may reside in any location on pin 336 that is detectable by camera 320. Detection member 336 may be formed from plastic, composite material, metal, or any other suitable material that performs the functions described above.

Figure 4:
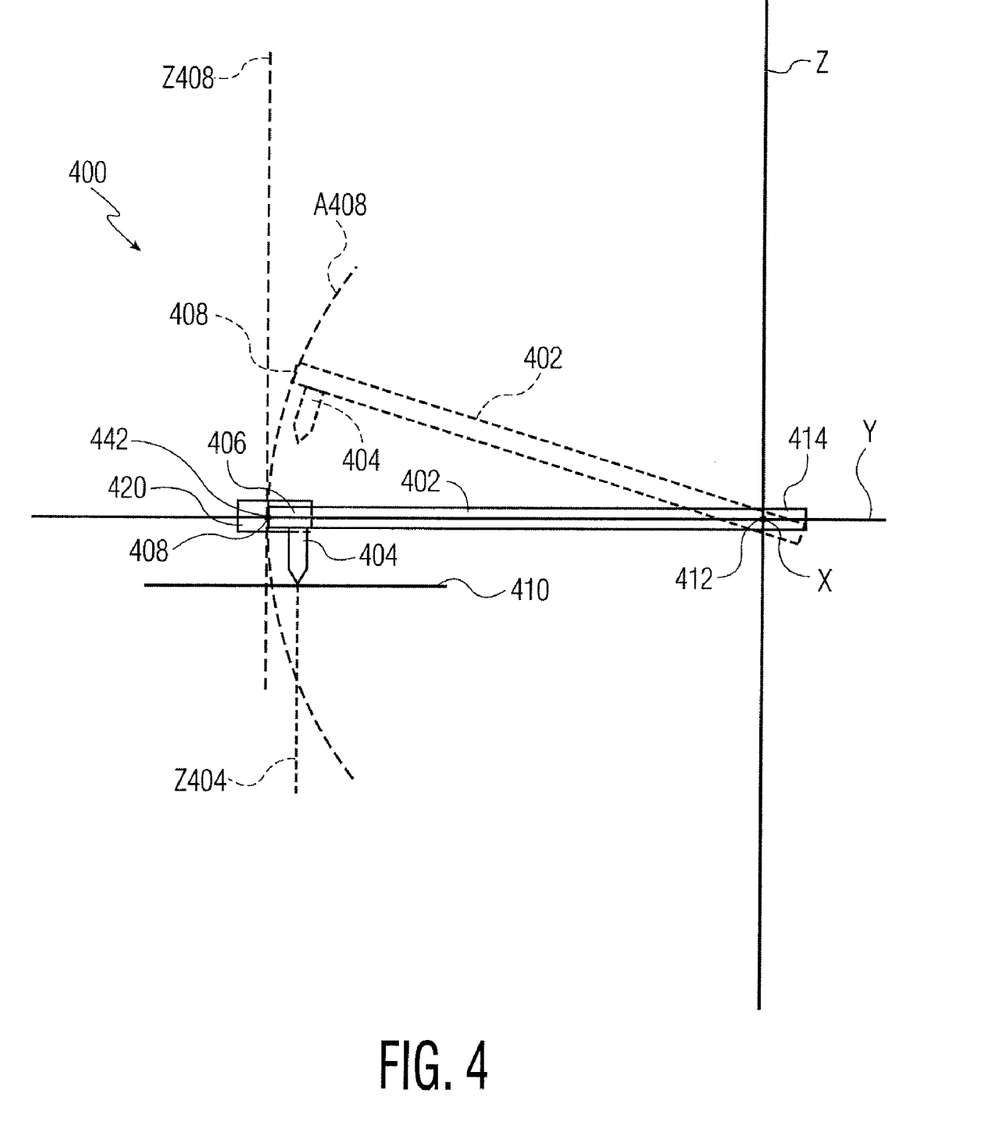
FIG. 4 is a right side view, block diagram representation of a bondhead assembly in accordance with yet another exemplary embodiment of the present invention.

FIG. 4 illustrates bondhead assembly 400 including transducer 402 and bonding tool 404. Bondhead assembly 400 is configured for substantially vertical movement with respect to bonding surface 410 during a wire bonding operation.

In contrast to the elevated location of cameras 220 and 320 of the wire bonding machine embodiments illustrated in FIGS. 2A-3B, the wire bonding machine of the embodiment represented in FIG. 4 includes camera 420 mounted to the left of transducer 404 (behind transducer 402 as represented in FIG. 4) with a field of view extending along the X axis out of the page of FIG. 4. Camera 420 configured to receive images of a portion of bondhead assembly 400, the images being used to determine a position where transducer 402 is substantially parallel to bonding surface 410 (and, thus, a position where bonding tool 404 of bondhead assembly 400 is substantially perpendicular to bonding surface 410) in conjunction with a Z axis calibration of bondhead assembly 400.

Depending upon the specific orientation of camera 420, the portion of bondhead assembly 400 to be read by camera 420 may be an area of at least one of transducer 402 and bonding tool 404. In other words, an area of transducer 402 or bonding tool 404 acts as a detection member of bondhead assembly 400. Thus, in such exemplary embodiments of the present invention, no distinct detection member is utilized in connection with a Z-axis calibration operation.

For the sake of explanation, in this example, forward-most point 408 of transducer 402 is used as a detection member of bondhead assembly 400. The point at which forward-most point 408 aligns with the Y axis is when transducer 402 is positioned substantially parallel to bonding surface 410. Similarly, the point at which arc A408 aligns with Z axis Z408 is when transducer 402 is positioned substantially parallel to bonding surface 410. Z axis Z408 is the Z axis through which arc A408 of forward-most point 408 passes that is furthest from the Z axis defined at pivot point 412. This point of alignment is defined as a "zero" parameter of bondhead assembly 400, and is labeled as numeral 442. Due to the substantially perpendicular relationship between transducer 402 and bonding tool 404, defining "zero" parameter 442 of bondhead assembly 400 also substantially defines the perpendicularity of bonding tool 404 with respect to bonding surface 410.

Thus, when forward portion 406 of transducer 402 is in field of view (not labeled for the sake of clarity) of camera 420, camera 420 detects when forward-most point 408 is furthest from the Z axis defined at pivot point 412, thereby determining the position where transducer 402 is substantially parallel to bonding surface 410 (in other words, the substantial perpendicularity of transducer 402 with respect to the Z axis).

As explained above, for the sake of explanation, in the example represented in FIG. 4 forward-most point 408 of transducer 402 is used as the detection member of bondhead assembly 400. Alternatively, any point on transducer 402 or bonding tool 404 that can be detected by camera 420 may be utilized. Further, while camera 420 is shown in a given position with respect to bondhead assembly 400, alternative positions are contemplated so long as the camera can view the desired location of the bondhead assembly.

Figure 5:
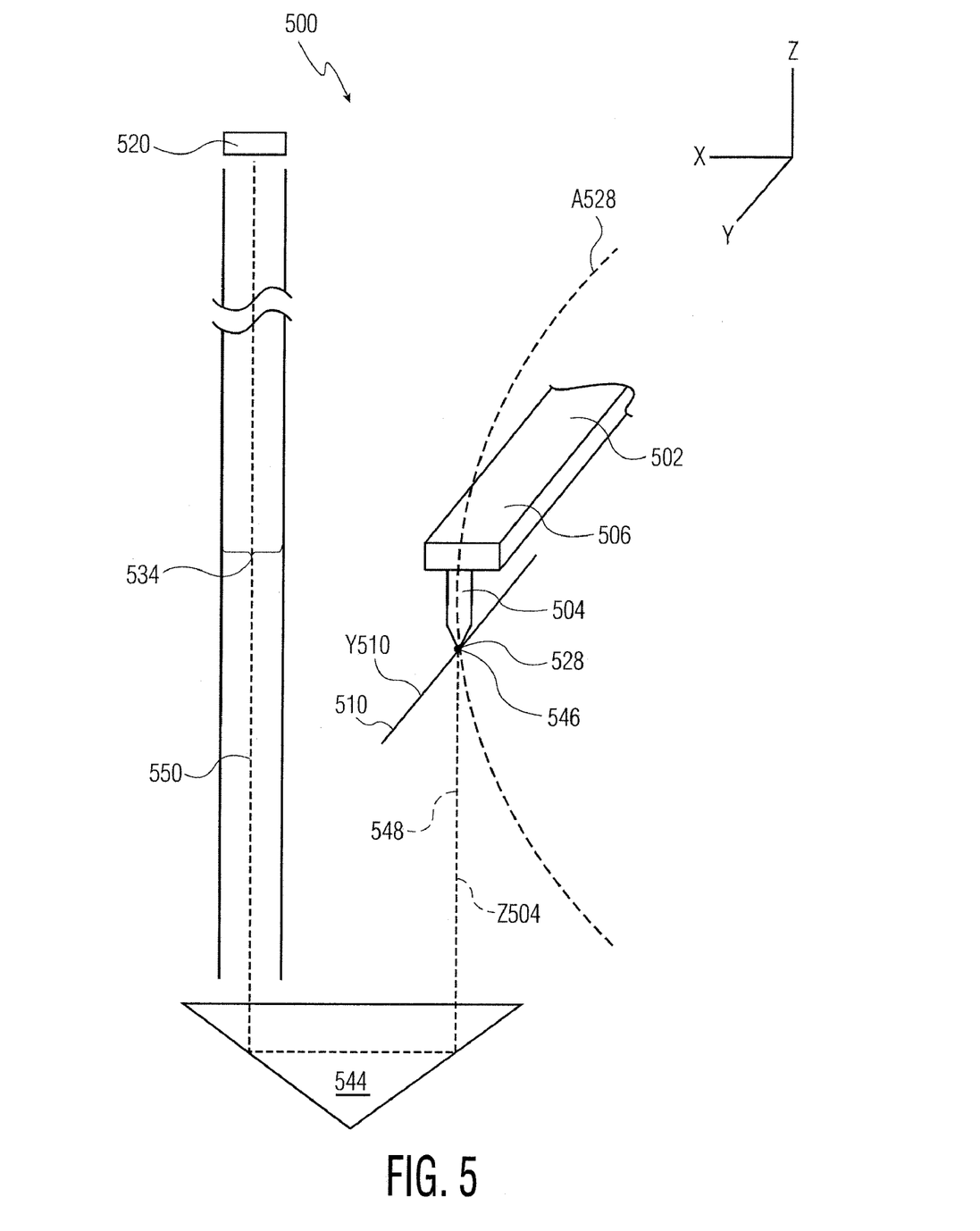
FIG. 5 is a perspective detail view of a portion of a bondhead assembly in accordance with yet another exemplary embodiment of the present invention.

FIG. 5 illustrates bondhead assembly 500 including transducer 502 and bonding tool 504. Bondhead assembly 500 is configured for substantially vertical movement with respect to bonding surface 510 during a wire bonding operation.

In contrast to cameras 220, 320 of the wire bonding machine embodiments illustrated in FIGS. 2A-3B having respective fields of view 234, 334 encompassing respective detection members 218, 336, the wire bonding machine of the embodiment represented in FIG. 5 includes camera 520 mounted such that its field of view 534 does not extend directly to a portion of bondhead assembly 500 and, instead, encompasses an optical apparatus 544 as represented in FIG. 5.

Optical apparatus 544 is configured to transmit imaging of a portion of bondhead assembly 500 to camera 520. In the illustrated example in FIG. 5, optical apparatus 544 is a cornercube offset tool 544 having at least one reflective surface (not shown); however, alternative optical apparatuses (e.g., prisms) are contemplated. Cornercube offset tools are disclosed for use with a wire bonding machine in U.S. Pat. No. 6,412,683 entitled "Cornercube Offset Tool."

For the sake of explanation, in this example, tip 528 of bonding tool 504 is used as a detection member of bondhead assembly 500. The point at which tip 528 aligns with Y axis Y510 is when transducer 502 is positioned substantially parallel to bonding surface 510. Similarly, the point at which arc A528 aligns with Z axis Z504 is when transducer 502 is positioned substantially parallel to bonding surface 510. Z axis Z504 is the Z axis through which arc A528 of tip 528 passes that is furthest from the Z axis defined at the pivot point (not shown) of bondhead assembly 500. This point of alignment is defined as a "zero" parameter of bondhead assembly 500, and is labeled as numeral 546. Due to the substantially perpendicular relationship between transducer 502 and bonding tool 504, defining "zero" parameter 546 of bondhead assembly 500 also substantially defines the perpendicularity of bonding tool 504 with respect to bonding surface 510.

When tip 528 of bonding tool 504 is detected by image ray 548 passing through optical apparatus 544, optical apparatus 544 transmits imaging of tip 528 through a series of reflective surfaces (not shown) of optical apparatus 544 to camera 520 along image ray 550. Thus, camera 520 detects when tip 528 of bonding tool 504 is furthest from the Z axis defined at the pivot point of bondhead assembly 500, thereby determining the position where transducer 502 is substantially parallel to bonding surface 510 (in other words, the substantial perpendicularity of transducer 502 with respect to the Z axis).

As explained above, in the example represented in FIG. 5, tip 528 of bonding tool 504 is used as the detection member of bondhead assembly 500. Alternatively, any point on transducer 502 or bonding tool 504 that can be transmitted through optical apparatus 544 and detected by camera 520 may be utilized.

Furthermore, although the embodiment of the wire bonding machine represented in FIG. 5 includes camera 520 mounted at the left side of transducer 502, camera 520 may be mounted in any location (e.g., in a forward position relative to forward portion 506 of transducer 502) suitable for detecting and identifying a zero parameter of bondhead assembly 500 in conjunction with optical apparatus 544.

The present invention is not limited to the specific orientations of cameras and detection members illustrated in FIGS. 2A-5, and may include any variety of configurations that achieve the functions described above. For example, marker 226 of detection member 218 of bondhead assembly 200 of FIGS. 2A and 2B may extend out of the page of FIG. 2A and camera 220 may be mounted at the right side of transducer 202 (in front of transducer 202 with respect to the X axis as represented in FIG. 2A). Similarly, for example, camera 420 of the exemplary wire bonding machine of FIG. 4 may be mounted to the right of transducer 404 (in front of transducer 402 as represented in FIG. 4) with a field of view extending along the X axis into the page of FIG. 4. Furthermore, each camera utilized throughout the various exemplary embodiments of the present invention may be an existing part of the particular wire bonding machine (e.g., a camera used to perform pattern recognition in connection with a device to be wirebonded) or, alternatively, may be an additional camera added to the wire bonding machine.

Because calibration of a bondhead assembly is typically conducted only during the initial set-up of a wire bonding machine, it is contemplated that in certain embodiments the detection member of the present invention may be easily and conveniently installed and removed from the bondhead. For example, detection members (e.g., detection member 218, 336, etc.) may be removed after a calibration operation. Of course, due to the use of a camera to identify the "zero" parameter of the inventive bondhead assembly, the wire bonding machine operator does not have to possess the specific manual calibration skills associated with conventional calibration methods for bondheads and, thus, the bondhead assembly of the present invention reduces the incidence of human error. Furthermore, the automatic nature of the present invention eliminates the time and cost associated with conventional calibration methods for bondheads.

Although the present invention has been illustrated and described primarily with respect to ball bonding tools (e.g., a capillary tool) on ball bonding machines, it is not limited thereto. For example, the inventive bondhead assembly disclosed herein may be applicable to other types of bonding tools for forming conductive interconnections, for example, wedge bonding tools on wedge bonding machines, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wire bonding machine comprising:
   a bondhead assembly including a transducer and a bonding tool, the bonding tool being attached to the transducer at an attachment portion of the transducer, the bondhead assembly being configured for substantially vertical movement with respect to a bonding surface of the wire bonding machine during a wire bonding operation;
   a detection member coupled to a tip end of the bonding tool, the detection member being distinct from the attachment portion of the transducer; and
   a camera having a field of view directly below the camera and offset from the bondhead assembly, the detection member including a portion extending away from the bonding tool and into the field of view of the camera directly below the camera, the camera being configured to receive images of the portion of the detection member, the images being used to determine a position where a length of the transducer is substantially parallel to the bonding surface.

2. The wire bonding machine of claim 1, wherein the camera is configured to determine the position where the length of the transducer is substantially parallel to the bonding surface in conjunction with a Z axis calibration of the bondhead assembly.

3. The wire bonding machine of claim 1, wherein the detection member defines an aperture to receive a portion of the bonding tool.

4. The wire bonding machine of claim 3, wherein the aperture of the detection member receives the tip end of the bonding tool.

5. The wire bonding machine of claim 1, wherein the detection member comprises:
   a bonding tool engagement mechanism configured to be connected to the bonding tool; and
   a predetermined image point on the portion extending away from the bonding tool and into the field of view of the camera, the camera being configured to receive images of the predetermined image point to derive the position where the length of the transducer is substantially parallel to the bonding surface.

6. The wire bonding machine of claim 5, wherein the bonding tool engagement mechanism defines an aperture configured to receive a portion of the bonding tool for securement to the bonding tool during calibration of the bondhead assembly.

7. The wire bonding machine of claim 5, wherein the detection member is formed as one piece.

8. The wire bonding machine of claim 1, wherein the bonding tool is substantially perpendicular to the bonding surface at the position where the length of the transducer is substantially parallel to the bonding surface.

9. The wire bonding machine of claim 1, wherein the substantially vertical movement of the bond head assembly is along an arc shaped path.

10. The wire bonding machine of claim 1, wherein the detection member includes a plurality of pieces.

11. The wire bonding machine of claim 1, wherein the camera is also configured to receive images of a work piece supported by the bonding surface.

12. The wire bonding machine of claim 1, wherein the detection member is coupled to the bonding tool by at least one of a press fit, an adhesive, and a snap fit.

13. The wire bonding machine of claim 1, wherein the the position where the length of the transducer is substantially parallel to the bonding surface corresponds to the zero parameter of the bondhead assembly.

* * * * *